United States Patent
Ko et al.

(10) Patent No.: US 8,368,130 B2
(45) Date of Patent: Feb. 5, 2013

(54) METHOD AND DEVICE TO REDUCE DARK CURRENT IN IMAGE SENSORS

(75) Inventors: Chun-Yao Ko, Bade (TW); Chung-Wei Chang, Hsin-Chu (TW); Han-Chi Liu, Miaoli County (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 12/968,047

(22) Filed: Dec. 14, 2010

(65) Prior Publication Data

US 2011/0133260 A1    Jun. 9, 2011

Related U.S. Application Data

(62) Division of application No. 11/735,226, filed on Apr. 13, 2007, now Pat. No. 7,879,639.

(51) Int. Cl.
*H01L 27/146*   (2006.01)
*H01L 31/0232*  (2006.01)
*H01L 31/0352*  (2006.01)

(52) U.S. Cl. ......... 257/292; 257/432; 257/607; 438/59; 438/69; 438/237; 438/200

(58) Field of Classification Search ............ 438/22, 438/199, 21, 69; 257/292, E31.083, 541, 257/542
See application file for complete search history.

(56) References Cited

U.S. PATENT DOCUMENTS

| | | | |
|---|---|---|---|
| 6,395,576 B1 | 5/2002 | Chang et al. | |
| 6,541,329 B1 | 4/2003 | Chen et al. | |
| 6,583,484 B2 | 6/2003 | Pan et al. | |
| 6,949,388 B2 | 9/2005 | Park | |
| 7,151,303 B2 | 12/2006 | Wang et al. | |
| 7,425,461 B2 | 9/2008 | Mouli | |
| 7,598,136 B2 | 10/2009 | Park et al. | |
| 7,642,608 B2* | 1/2010 | Fan et al. | 257/409 |
| 7,759,759 B2* | 7/2010 | Tsuchiko | 257/471 |
| 7,799,654 B2 | 9/2010 | Hsieh et al. | |
| 2003/0169360 A1* | 9/2003 | Rhodes | 348/308 |
| 2005/0001143 A1* | 1/2005 | Rhodes | 250/208.1 |
| 2005/0059180 A1* | 3/2005 | Rhodes | 438/22 |
| 2006/0163628 A1* | 7/2006 | Mori et al. | 257/291 |
| 2008/0105944 A1* | 5/2008 | Chang et al. | 257/461 |

* cited by examiner

*Primary Examiner* — Olik Chaudhuri
*Assistant Examiner* — Wilner Jean Baptiste
(74) *Attorney, Agent, or Firm* — Haynes and Boone, LLP

(57) ABSTRACT

A method to fabricate an image sensor includes providing a semiconductor substrate having a pixel area and a logic area, forming a light sensing element in the pixel area, and forming a first transistor in the pixel area and a second transistor in the logic area. The step of forming the first transistor in the pixel area and the second transistor in the logic area includes performing a first implant process in the pixel area and the logic area, performing a second implant process in the pixel area and the logic area, and performing a third implant process only in the logic area.

20 Claims, 7 Drawing Sheets

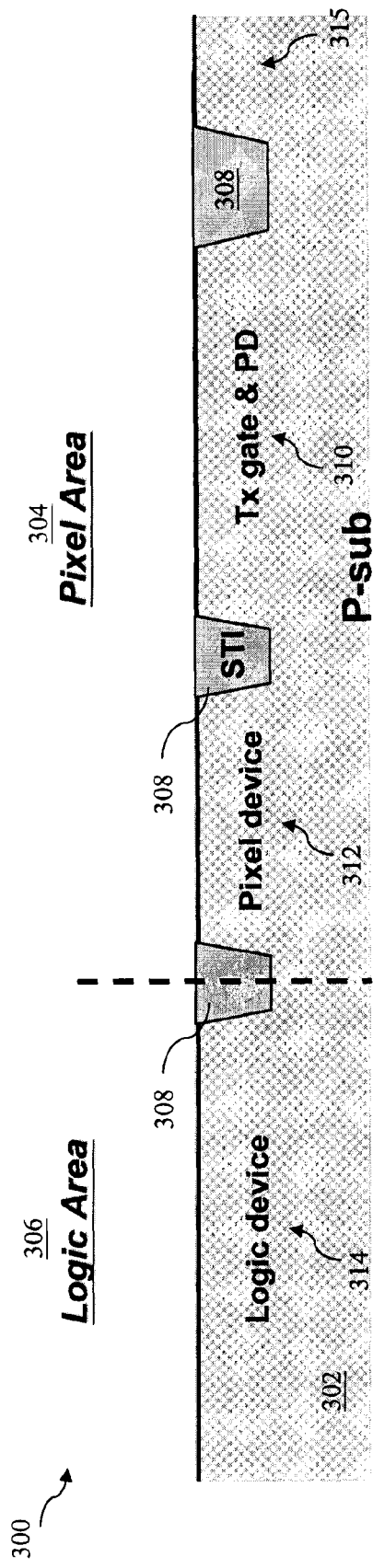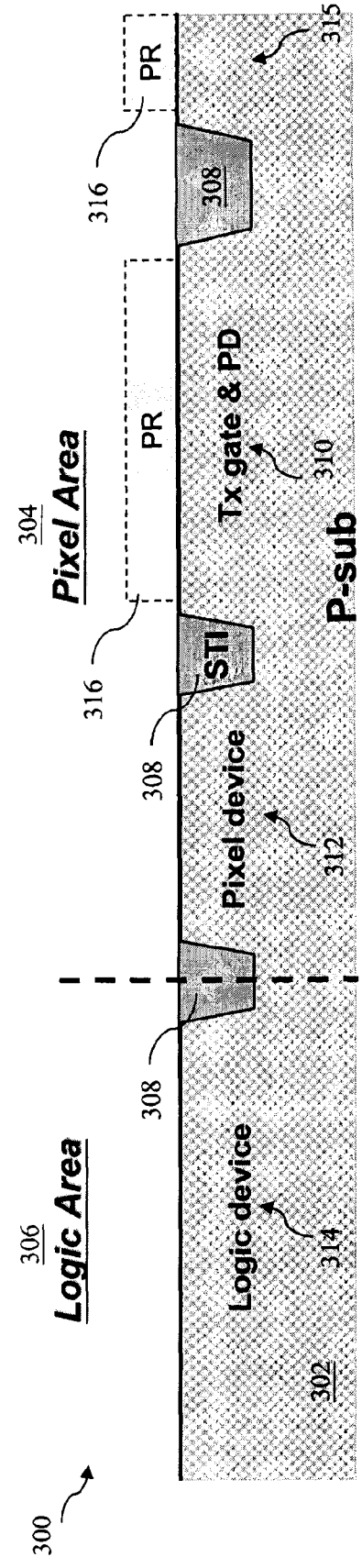
Fig. 3A
Fig. 3B

METHOD AND DEVICE TO REDUCE DARK CURRENT IN IMAGE SENSORS

CROSS-REFERENCE TO OTHER APPLICATIONS

This application is a divisional of U.S. application Ser. No. 11/735,226, filed Apr. 13, 2007, which is incorporated herein by reference in its entirety.

BACKGROUND

The present disclosure relates generally to image sensors and, more particularly, to complementary metal-oxide-semiconductor (CMOS) image sensors.

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera applications. These devices utilize an array of pixels or image sensor elements, including photodiodes and transistors, to collect photo energy to convert images into electrical signals.

However, image sensor devices suffer from dark current. That is, unwanted current generated by pixels in the absence of illumination. There may be different sources of dark current such as impurities in the silicon wafer, damage to the silicon crystal lattice by processing techniques, and heat build up in the pixel area. Excessive dark current may lead to image degradation and poor device performance.

Therefore, what is needed is a simple and cost-effective method and device for reducing dark current in image sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A through 3H are cross-sectional views of an image sensor being processed according to the method of FIG. 2.

DETAILED DESCRIPTION

Figure 1:
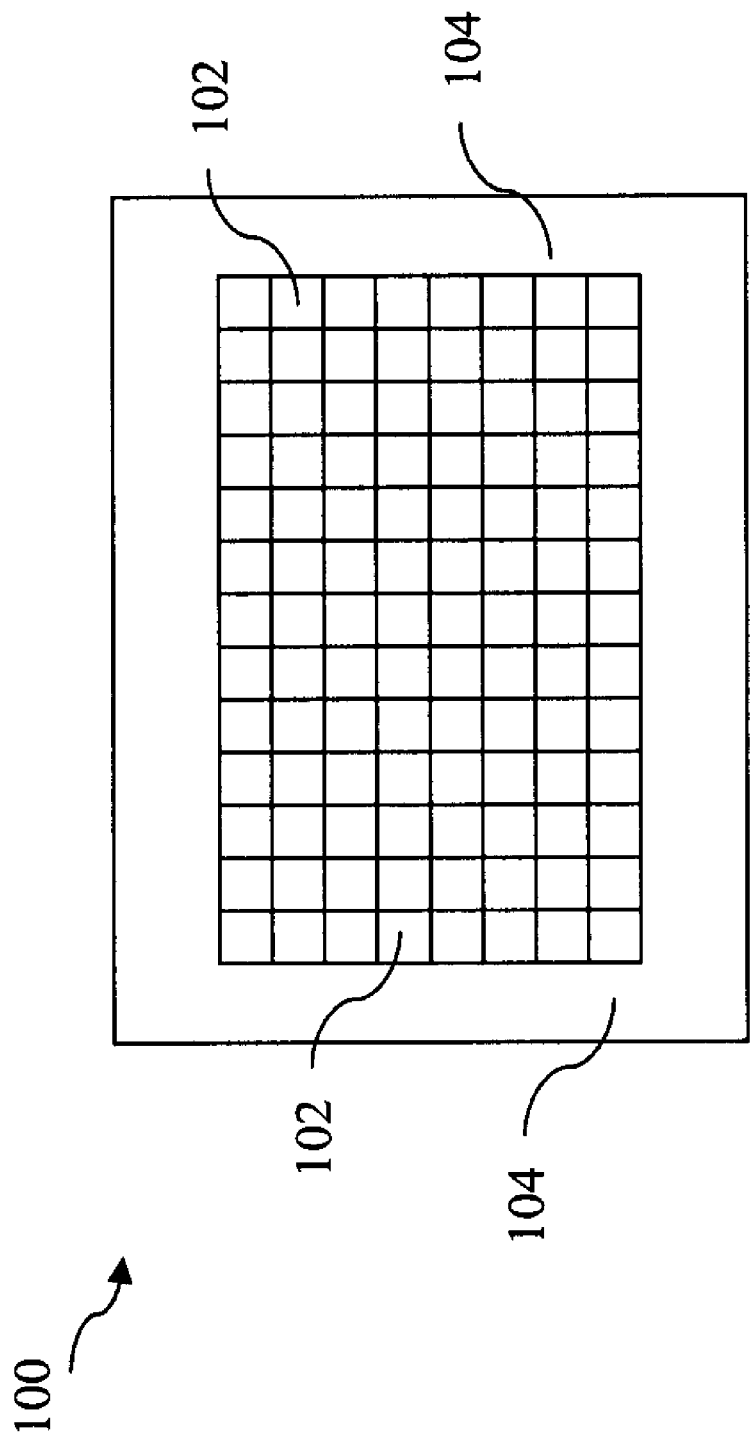
FIG. 1 is a top view of an image sensor including a plurality of pixels according to one or more embodiments of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a top view of an image sensor 100 including a grid or array of pixels 102 (sometimes referred to as image sensor elements). Additional circuitry and input/outputs are typically provided in a logic or periphery region 104 adjacent to the grid of pixels 102 for providing an operation environment for the pixels and for supporting external communications with the pixels. The image sensor 100 may include a charge-coupled device (CCD) sensor, complimentary metal oxide semiconductor (CMOS) image sensor (CIS), an active-pixel sensor, and a passive-pixel sensor. Additionally, the image sensor 100 may be a front-side or back-side illuminated sensor.

Figure 2:
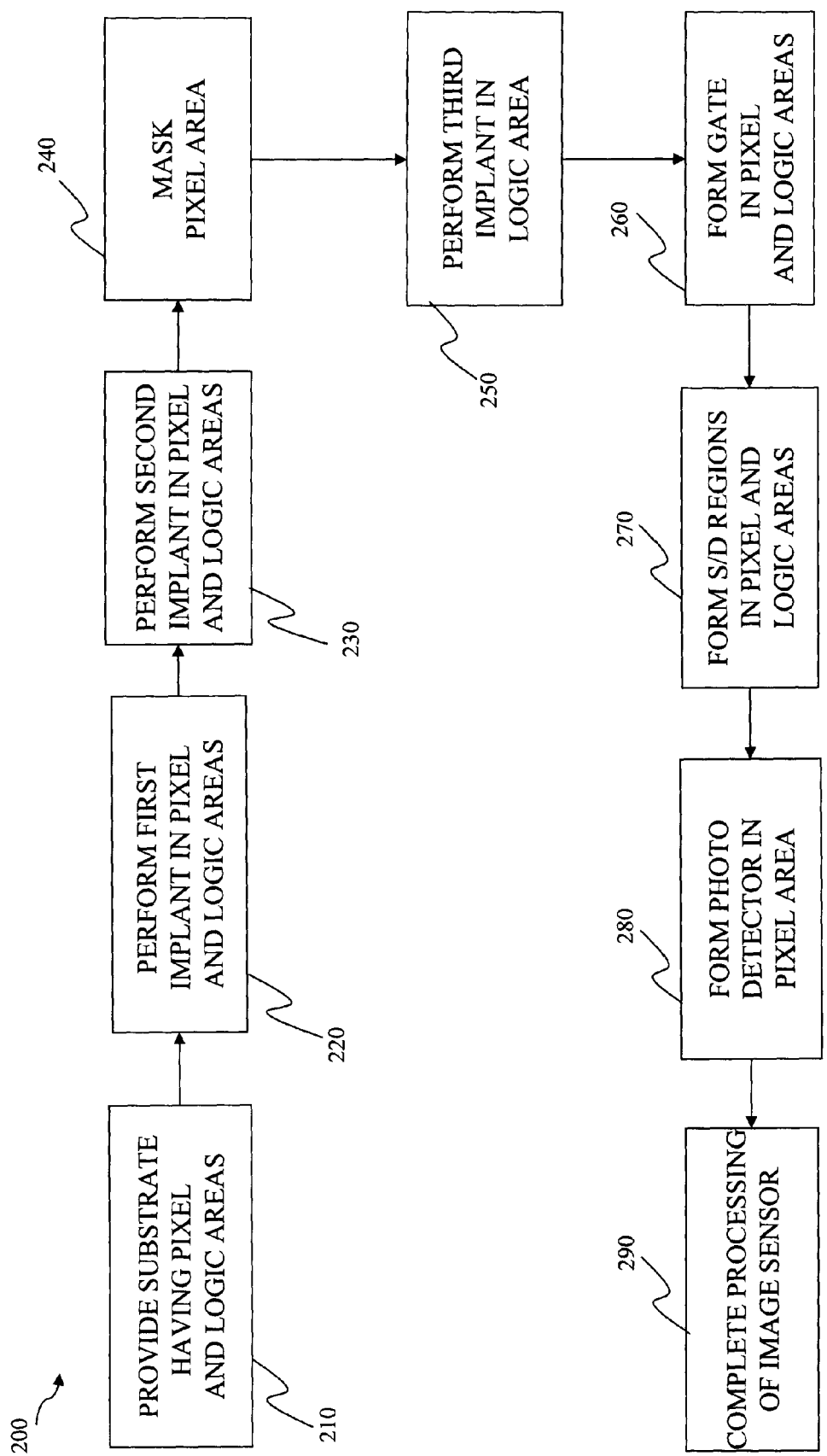
FIG. 2 is a flow chart of a method for fabricating an image sensor according to one or more embodiments of the present disclosure.
Figure 3C:
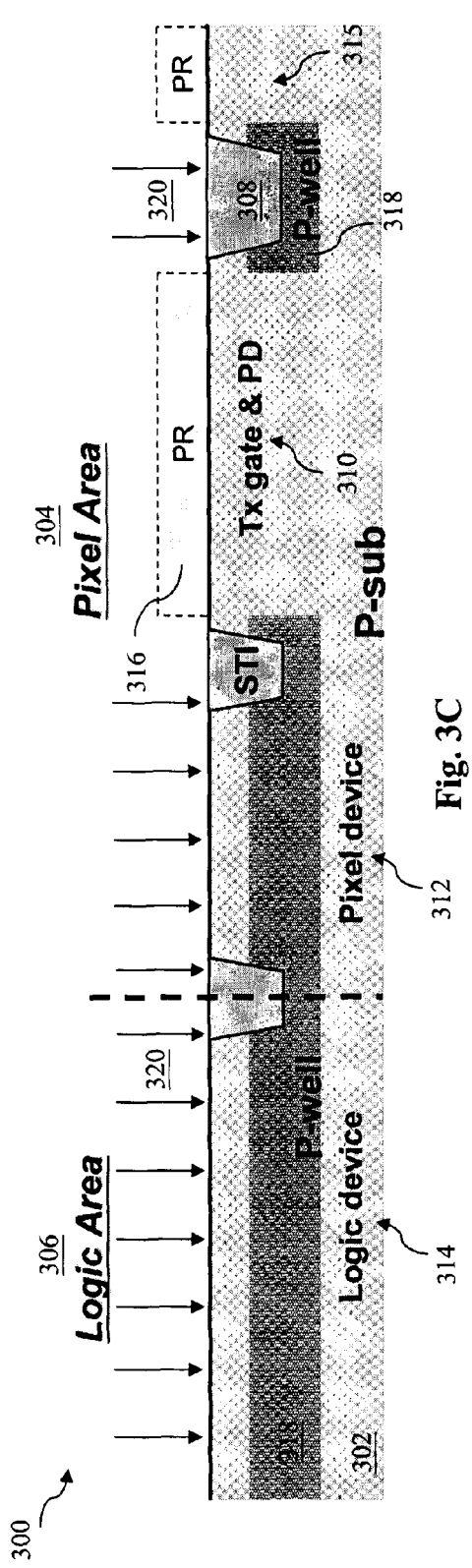

Referring to FIG. 2, illustrated is a flow chart of a method 200 for fabricating an image sensor according to one or more embodiments of the present disclosure. Referring also to FIGS. 3A through 3H, illustrated are cross-sectional views of an image sensor 300 being processed according to the method 200 of FIG. 2. The image sensor 300 may be fabricated by CMOS processing techniques known in the art. In FIGS. 2 and 3A, the method 200 begins with step 210 in which a semiconductor substrate 302 may be provided having a pixel area 304 and logic (or periphery) area 306. The image sensor 300 may comprise an array or grid of pixels (as shown in FIG. 1) even though one exemplary pixel area 304 is shown for simplicity and clarity. The image sensor 300 may be configured as an active-pixel sensor wherein each pixel area 304 includes a photo detector and a number of transistors. The pixel area 304 may be configured to absorb light radiation and generate optical charges or photo-electrons that are collected and accumulated in a light sensing region of the photo detector. The transistors may be configured to readout the generated photo-electrons and convert them into an electrical signal. The logic area 306 may include various transistors and/or other microelectronic devices for providing an operation environment for the pixels 304 and for supporting external communications with the pixels.

The semiconductor substrate 302 may include a silicon substrate in a crystalline structure. The substrate 302 may also include other elementary semiconductors such as germanium. Alternatively, the substrate 302 may optionally include a compound semiconductor such as silicon carbide, gallium arsenic, indium arsenide, and indium phosphide. In the present embodiment, the substrate 302 may include a P-type silicon substrate (P-substrate). The P-substrate may be formed by heavily doping the silicon with a P-type dopant, such as boron, $BF_2$, or other suitable material. The doping may be implemented by an ion implantation or a diffusion process known in the art. The substrate 302 may include a P-type epilayer (P-epilayer) (not shown). The P-epilayer may be formed by an epitaxial growth process. The P-epilayer may be configured to have a lower concentration of the P-type dopant than the P-substrate.

The image sensor 300 may further comprise a plurality of isolation features 308 such as shallow trench isolation (STI) features. The isolation features 308 may define and isolate active regions 310, 312, 314, 315 for various microelectronic devices, such as transistors and photo detectors, of the image sensor 300. The isolation features 308 may be formed in the semiconductor substrate 302 by a suitable process known in the art. For example, the STI features may be formed by patterning the substrate 302 by photolithography, etching the substrate by plasma etching to form various trenches, and filling the trenches with a dielectric material such as silicon oxide by a chemical vapor deposition (CVD) process. The CVD process may utilize a high density plasma CVD (HD-PCVD) to achieve a better planar surface of the STI features. The STI features may further include an oxide layer lining the side walls.

The method 200 continues with step 220 in which a first implantation process may be performed to form a well of a first type of conductivity in the substrate. In FIG. 3B, a patterned photoresist layer 316 may be formed by photolithography over the substrate 302. The patterned photoresist layer 316 may protect regions 310, 315 in the pixel area 304 from the first implantation process. These regions 310, 315 may be subsequently processed to form various microelectronic devices.

In FIG. 3C, the well of the first type of conductivity may include a P-type well (P-well) 318 formed by an ion implantation process 320. The P-well 318 may be formed in regions of the pixel area 304 and logic area 306 that are exposed by the patterned photoresist layer 316. Additionally, the P-well 318 may include a guard ring P-well formed underlying the STI features 308 that isolate the light sensing region 310 of the pixel area 304. These guard ring P-wells may help prevent the diffusion of photo-electrons generated in one pixel area 304 to an adjacent pixel area. The ion implantation process 320 may include an ion implanter that utilizes boron or other suitable material as a doping impurity (or dopant). The ion implanter may utilize high energy to penetrate through the substrate 302 at an appropriate junction depth for the P-well 318. For example, an implantation energy may be about 160 KeV and an implantation dosage may be about 1.5E13 atoms/$cm^2$. The P-well 318 may have a junction depth ranging from about 0.5 μm to 1.0 μm.

Figure 3D:
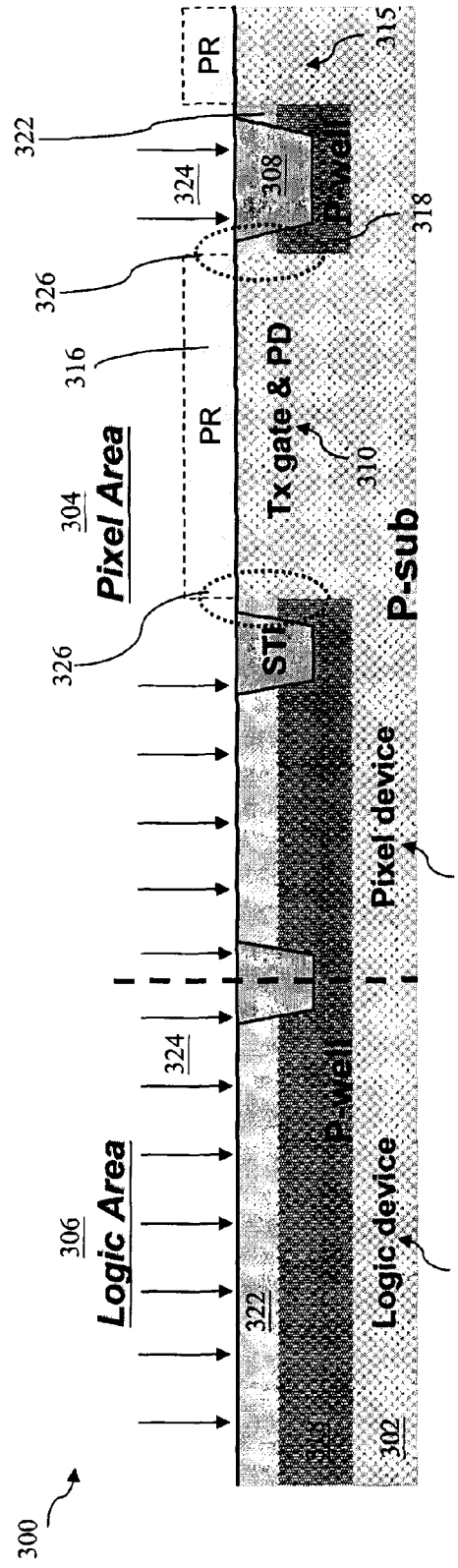

The method 200 continues with step 230 in which a second implantation process of the first type of conductivity may be performed to the same regions in the pixel area 304 and logic area 306 that are exposed by the patterned photoresist layer 316. The second implantation process may utilize a lower energy as compared to the first implantation process and thus, a shallow penetration depth may be achieved. In FIG. 3D, a shallow P-type well (P-well) 322 may be formed by an ion implantation process 324. The shallow P-well 322 may be implanted over the P-well 318 to set up a threshold operating voltage for a microelectronic device such as transistor in the pixel area 304 and logic area 306. Additionally, the shallow P-well 322 may be implanted for sidewall passivation 326 of the STI features 308 that isolate the light sensing region 310 of the pixel area 304.

It has been observed that utilizing indium as a doping impurity (or dopant) for the second implantation process produces high dark current in the pixel area 304 due to damage of the substrate 302 during implantation. The high dark current may lead to image degradation and poor device performance. Accordingly, the ion implantation process 324 may utilize boron (which has a smaller atomic weight) as the doping impurity to minimize the damage to the substrate 302 and thus, reducing the dark current in the pixel area 304. For example, an implantation energy may be about 25 KeV and an implantation dosage may be about 6.0E12 atoms/$cm^2$. Following the ion implantation process 324, the patterned photoresist layer 316 may be removed by wet stripping or plasma ashing.

Figure 3E:
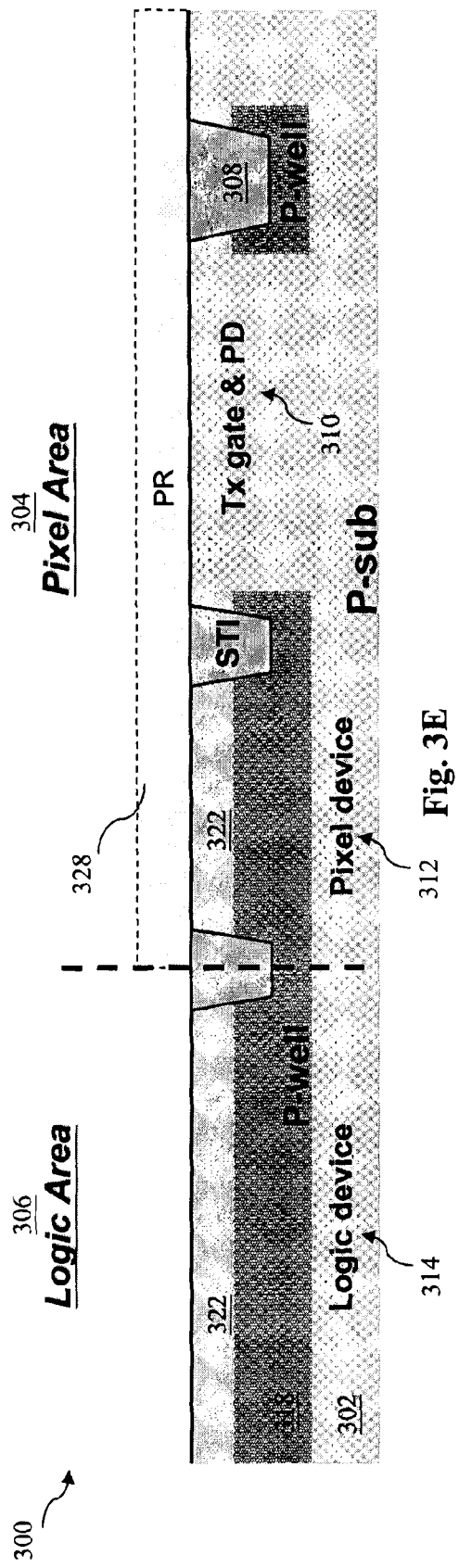

In FIGS. 2 and 3E, the method 200 continues with step 240 in which a patterned photoresist layer 328 may be formed protecting the pixel area 304 and exposing the logic area 306.

Figure 3F:
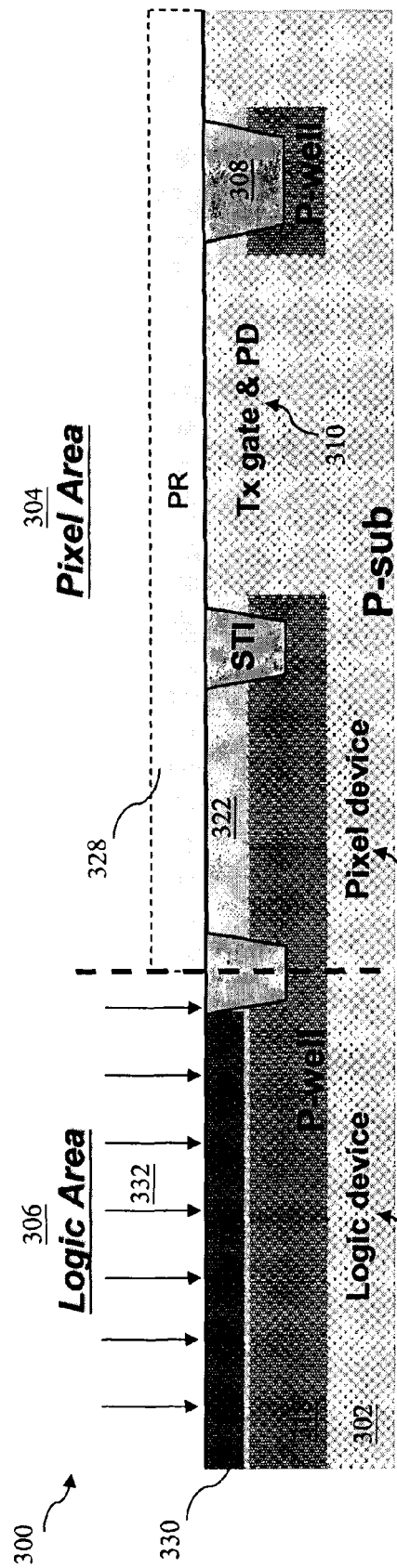

The method 200 continues with step 250 in which a third implantation process may be performed in the logic area 306. The third implantation process may include a dopant of the first type of conductivity to set up a threshold voltage for the microelectronic device such as a transistor in the logic area 306. In FIG. 3F, the third implantation process may include a two part ion implantation process 332. For example, the first part ion implantation may utilize boron as a doping impurity. The first part ion implantation may have an implantation energy of about 25 KeV and an implantation dosage of about 2.3E12 atoms/$cm^2$. The second part ion implantation may utilize indium as a doping impurity. The second part ion implantation process may have an implantation energy of about 170 KeV and an implantation dosage of about 7.0E12 atoms/$cm^2$. By implementing the two part ion implantation process 332, the performance of the logic device 314 such as a transistor of the image sensor 300 can be maintained at the same level as current image sensors. Following the two part ion implantation process 332, the patterned photoresist layer 328 may be removed by wet stripping or plasma ashing. It is understood that the image sensor 300 may also include formation of an N-well (not shown) proximate to the P-well to so that various transistors may be formed in the N-well.

Figure 3G:
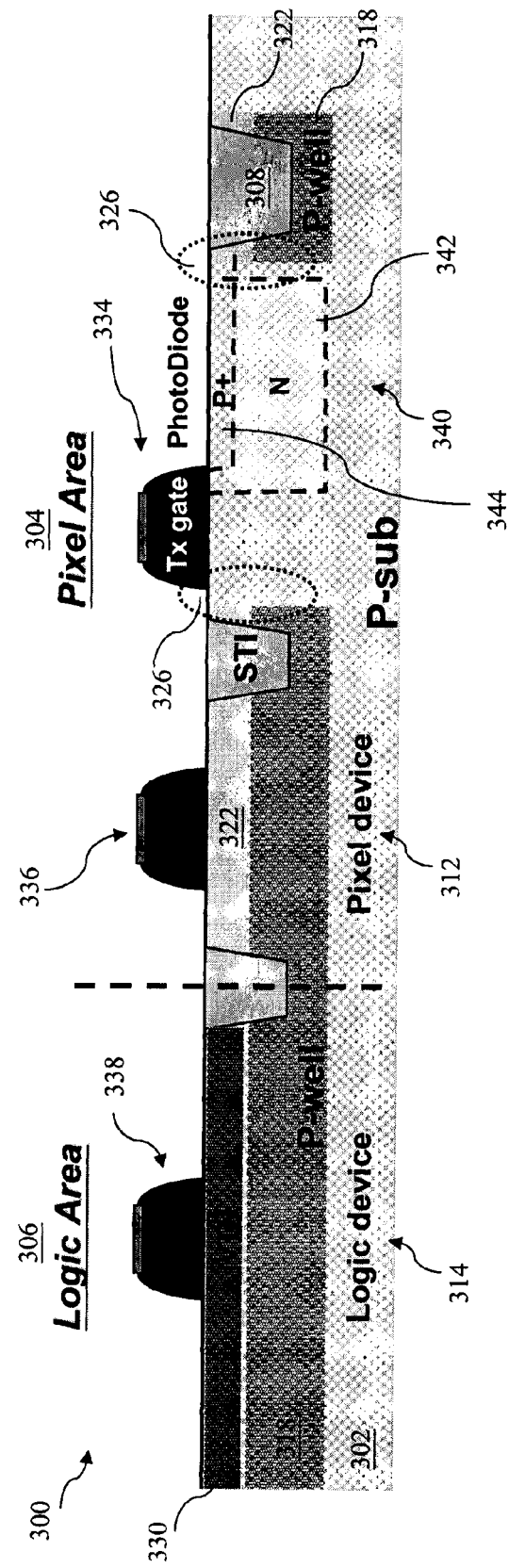

The method 200 continues with step 260 in which gate structures for transistors in the pixel area 304 and logic area 306 may be formed with current techniques and materials. The formation of the gate structures may include a gate oxide growth process, a polysilicon deposition process, and a pattern and etch process to provide a vertical profile for the gate structures. Additionally, sidewall spacers may be formed alongside the gate structures as is known in the art. In FIG. 3G, a plurality of gate structures 334, 336, 338, each having a gate electrode, gate dielectric, and sidewall spacers, may be formed for various transistors in the pixel area 304 and logic area 306. For example, a transfer gate transistor (Tx gate) may be formed in the light sensing region 310 of the pixel area 304. Other types of transistors, such as a reset transistor, row select transistor, source follower transistor, or combinations thereof, may be formed for the pixel device 312 of the pixel area 304. The various transistors in the pixel area 304 may be configured to readout the generated photo-electrons and convert them into an electrical signal. Additionally, the pixel area 304 may be configured such that several pixels may share a reset gate transistor and source follower transistor.

The transistors in the logic area 306 may be configured to provide an operation environment for the pixels 304 and for supporting external communications with the pixels. The logic region 306 may comprise a plurality of transistors even though one transistor is shown for simplicity and clarity. For example, a group of transistors for the logic device 314 may operate under 3.3V, whereas another group of transistors may operate under 1.8V.

The method 200 continues with step 270 in which source/drain (S/D) regions (not shown) may be formed for the transistors in the pixel area 304 and logic area 306. The S/D regions for the transistors may be formed by a series of ion implantation processes including implanting lightly doped drain (LDD) regions and higher doped source/drain regions. It is understood that the transistors may be configured as an N-type MOS (NMOS) transistor or P-type (PMOS) transistor depending on the type of well the transistors are formed in. The transistors in the pixel area 304 and logic area 306 may further include a metal contact made of a silicide, such as titanium silicide, tantalum silicide, nickel silicide, cobalt silicide, or other suitable material, formed over the gate electrode and/or S/D regions. The silicide may promote better adhesion between the silicon and metal conductor that is subsequently formed.

The method 200 continues with step 280 in which a photo detector may be formed in the pixel area 304. For example, the pixel area 304 may include a photodiode 340 for sensing an amount of light radiation directed towards the pixel area 304. In the present embodiment, the photodiode 340 is an N-type photodiode. The photodiode 340 may comprise of an N-type doped region 342 formed in the P-substrate or P-epilayer. The N-type doped region 342 may be formed by ion implantation with an N-type dopant such as phosphorus, arsenic, or other suitable material. The photodiode 340 may further include a heavily doped P-type region 344 (also referred to as P-type pinned layer) formed on the surface of the N-type doped region 342. Accordingly, the P-N-P junction region (referred also as the depletion region) makes up the light sensing region of the photodiode 340. Additionally, since the second implantation process (of step 230) caused minimal damage to areas 326 of the substrate 302 that are proximate to the photodiode 340, less dark current will be generated in the photodiode. Another example of a photodiode that can be used is shown in U.S. patent application Ser. No. 11/291,880, filed on Dec. 1, 2005, which is hereby incorporated by reference. Alternatively, other types of light sensing elements or photo-detectors may optionally be used such as a photogate and photo transistor.

Figure 3H:
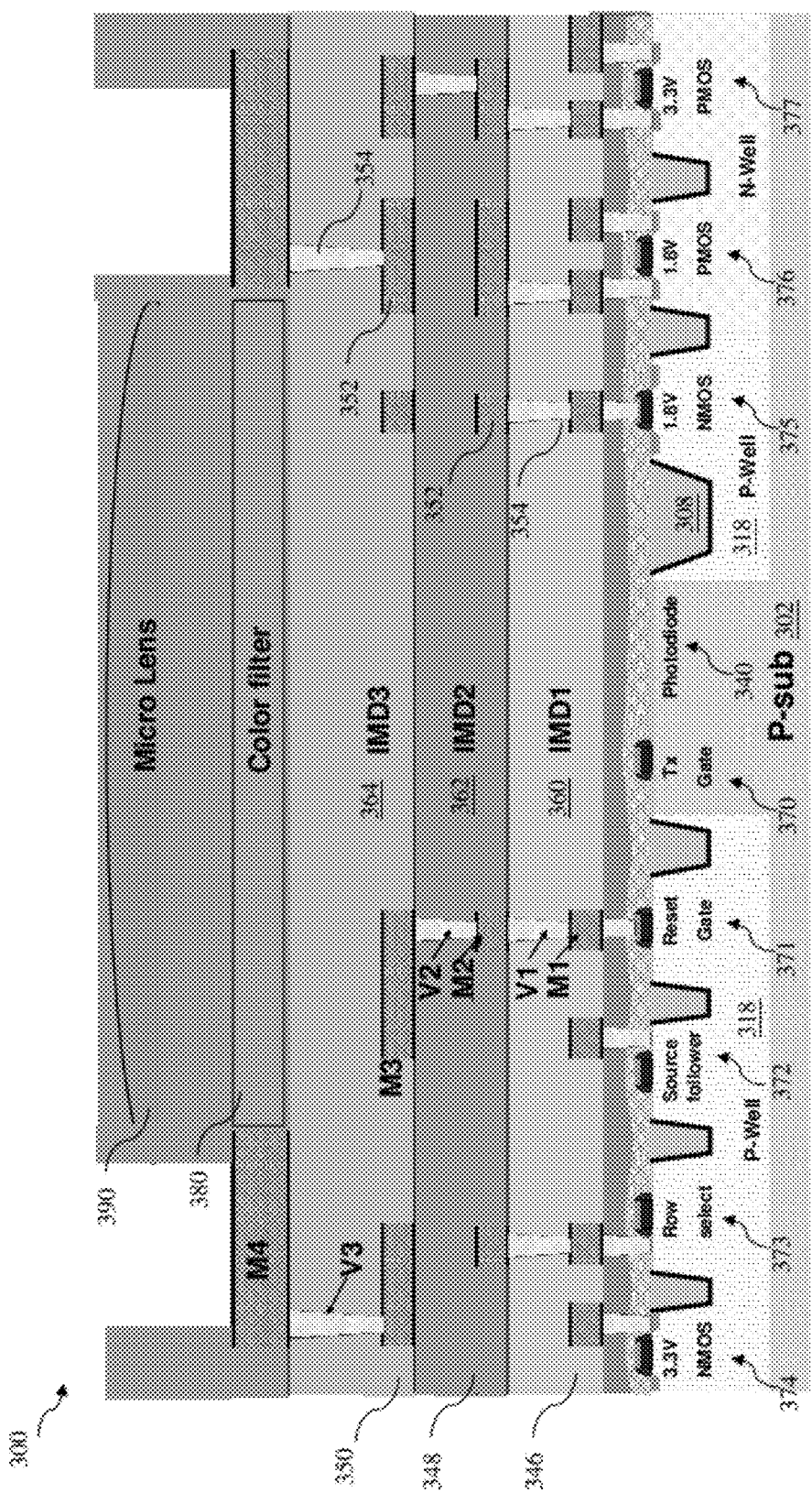

The method continues with step 290 in which processing of the image sensor 300 may be completed. In FIG. 3H, illustrated is a cross-sectional view of the completed image sensor 300. The image sensor 300 may further comprise a plurality of interconnect metal layers 346, 348, 350 (or multi-layer interconnect structure) for providing connections between the various microelectronic devices of the image sensor and between the interconnect metal layers themselves. The number of interconnect metal layers may vary depending on the design of the particular image sensor. The interconnect metal layers 346, 348, 350 may include conductive materials such as aluminum, aluminum/silicon/copper alloy, titanium, titanium nitride, tungsten, polysilicon, metal silicide, or combinations thereof. The interconnects 346, 348, 350 may be formed by a process including physical vapor deposition (or sputtering), chemical vapor deposition (CVD), or other suitable technique. Alternatively, the interconnect metal layers 346, 348, 350 may include copper, copper alloy, titanium, titanium nitride, tantalum, tantalum nitride, tungsten, polysilicon, metal silicide, or combinations thereof. The interconnect metal layers 346, 348, 350 may further include a plurality of contacts 352 and vias 354 to connect between the metal layers.

The interconnect metal layers 346, 348, 350 may be disposed and insulated in an interlayer dielectric 360, 362, 364. The interlayer dielectric 360, 362, 364 may include a material of a low dielectric constant such as a dielectric constant less than about 3.5. The interlayer dielectric 360, 362, 364 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, SiLK (Dow Chemical, Midland, Mich.), polyimide, and/or other suitable materials. The interlayer dielectric 360, 362, 364 may be formed by a technique including spin-on, CVD, or sputtering. Additionally, the interconnect metal layer 342, 344, 346 and interlayer dielectric 360, 362, 364 may be formed in an integrated process such as a damascene process or lithography/plasma etching process.

As previously discussed, the image sensor 300 may comprise various microelectronic devices, such as transistors and photo detectors. For example, the image sensor 300 may be configured as an active pixel configuration including a photodiode 340, a transfer gate transistor 370, reset gate transistor 371, source follower transistor 372, and row select transistor 373. Additionally, the image sensor 300 may further comprise other transistors that provide an operation environment for the pixels. These transistors include NMOS transistors 374, 375 (formed in the P-well) that operate under 3.3V and 1.8V, respectively, and PMOS transistors 376, 377 (formed in the N-well) that operate under 1.8V and 3.3V, respectively. It is understood that the configuration of the various microelectronic devices illustrated herein is a mere example and that other configurations may be implemented.

The image sensor 300 may further comprise a color filter 380 and a microlens 390 for filtering and directing light radiation towards the photodiode 340 during operation. Even though the color-filter 380 and microlens 390 are shown disposed on a front surface of the substrate 302, it is understood that the location of the color-filter and microlens will depend on whether the image sensor is configured as a frontside or backside illuminated image sensor. These features are well known in the art and, thus are not disclosed in detail here. In the disclosed image sensors, the light radiation that may be received during operation may not be limited to visual light (e.g., red, green, blue light), but can be extended to other types of light radiation such as infrared (IR) and ultraviolet (UV) light. Accordingly, the pixels and various other devices may be properly designed and configured for effectively reflecting and/or absorbing the corresponding light radiation beam.

Thus, the present disclosure provides a method for fabricating an image sensor device. The method includes providing a semiconductor substrate having a pixel area and a logic area; forming a light sensing element in the pixel area; and forming a first transistor in the pixel area and a second transistor in the logic area. The step of forming the first transistor in the pixel area and the second transistor in the logic area includes performing a first implant process in the pixel area and the logic area; performing a second implant process in the pixel area and the logic area; and performing a third implant process only in the logic area. In some embodiments, the step of forming the light sensing element includes configuring the light sensing element as a type selected from a group consisting of: a photodiode, pinned layer photodiode, photogate, and photo transistor. In other embodiments, the step of forming the first and second transistor includes configuring the first and second transistor as a type selected from a group consisting of: a transfer gate transistor, reset transistor, source follower transistor, row select transistor, NMOS transistor, PMOS transistor, and combinations thereof. In still other embodiments, the step of performing the first implant process includes implanting boron with an implantation energy of about 160 KeV and an implantation dosage of about 1.5E13 atoms/cm$^2$.

In some embodiments, the step of performing the second implant process includes implanting boron with an implantation energy of about 25 KeV and an implantation dosage of about 2.6E12 atoms/cm$^2$. In some other embodiments, the step of performing the third implant process includes performing a two part ion implantation process. In other embodiments, the two part ion implantation process includes implanting boron with an implantation energy of about 25 KeV and an implantation dosage of about 2.3E12 atoms/cm$^2$ and implanting indium with an implantation energy of about 170 KeV and an implantation dosage of about 7.0E12 atoms/cm$^2$. In other embodiments, the method further includes the step of forming shallow trench isolation (STI) features to isolate active regions in the pixel area and logic area, wherein the steps of performing the first and second implantation process forms a guard ring well underlying the STI features that isolate the light sensing element. In still other embodiments, the method further includes the steps of forming a metal interconnect layer and interlayer dielectric layer over the semiconductor substrate; forming a color filter aligned with the light sensing element; and forming a microlens over the color filter.

Additionally, the present disclosure provides an image sensor device including a semiconductor substrate having a pixel area and a logic area, a light sensing element formed in the pixel area, a first transistor formed in the pixel area, and a second transistor formed in the logic area. The first transistor includes a well of a first dopant and the second transistor includes a well of the first dopant and a second dopant. The first dopant has a smaller atomic weight than the second dopant. In some embodiments, the light sensing element is selected from a group consisting of: a photodiode, pinned layer photodiode, photogate, and photo transistor. In other embodiments, the first and second transistors are selected from a group consisting of: a transfer gate transistor, reset gate transistor, source follower transistor, row select transistor, NMOS transistor, PMOS transistor, and combinations thereof.

In still other embodiments, the image sensor device further includes a plurality of shallow trench isolation (STI) features for isolating active regions in the pixel and logic area; a guard ring well underlying each of the plurality of STI features; a metal interconnection layer and interlayer dielectric formed on the semiconductor substrate; a color filter aligned with the light sensing element in the pixel area; and a microlens formed over the color filter. In some embodiments, the first dopant includes boron. In some other embodiments, the second dopant includes indium.

Also, the present disclosure provides a method including providing a semiconductor substrate having a pixel area and a logic area; forming a plurality of isolation features to isolate active regions in the pixel area and logic area; forming at least one transistor in one of the active regions in the pixel area and at least one transistor in one of the active regions of the logic area; and forming a light sensing element in another one of the active regions in the pixel area. The step of forming the at least one transistor in the pixel area and the at least one transistor in the logic area includes performing a first implant in the pixel area and logic area with a first dopant; performing a second implant in the pixel area and logic area with the first dopant; and performing a third implant only in the logic area with the first dopant and a second dopant. In some embodiments, the first dopant includes boron and the second dopant includes indium.

In other embodiments, the step of performing the first and second implants includes masking the another one of the active regions of the pixel area. In some other embodiments, the light sensing element is selected from a group consisting of: a photodiode, pinned layer photodiode, photogate, and photo transistor. In still other embodiments, the at least one transistor in the pixel area and the at least one transistor in the logic area are of a type selected form a group consisting of: a transfer gate transistor, reset gate transistor, source follower transistor, row select transistor, NMOS transistor, PMOS transistor, and combinations thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above listed processing steps can be used in combination or in parallel. Also, features illustrated and discussed in some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure. For example, various features and the doping configurations disclosed herein may be reversed accordingly.

Several different advantages exist from these and other embodiments. In addition to providing an efficient and cost-effective method and device for reducing dark current in image sensors, the method and device disclosed herein can easily be integrated with current semiconductor processing techniques and equipment. Also, the method and device disclosed herein maintains current device performance, such as transistors and photodiodes, at the same level while reducing the dark current of the image sensor.

What is claimed is:

1. An image sensor device, comprising:
    a semiconductor substrate having a pixel area and a logic area;
    a light sensing element formed in the pixel area;
    a first transistor formed in the pixel area, the first transistor having a well of a first dopant;
    a second transistor formed in the logic area, the second transistor having a well of the first dopant and a second dopant;
    a plurality of shallow trench isolation (STI) features for isolating active regions in the pixel and logic area; and
    a guard ring well underlying each of the plurality of STI features,
        wherein the first dopant has a smaller atomic weight than the second dopant.

2. The device of claim 1, wherein the light sensing element is selected from a group consisting of: a photodiode pinned layer photodiode, photogate, and photo transistor.

3. The device of claim 2, wherein the first and second transistors are selected from a group consisting of: a transfer gate transistor, reset gate transistor, source follower transistor, row select transistor, NMOS transistor, PMOS transistor, and combinations thereof.

4. The device of claim 1, further comprising:
    a metal interconnection layer and interlayer dielectric formed on the semiconductor substrate;
    a color filter aligned with the light sensing element in the pixel area; and
    a microlens formed over the color filter.

5. The device of claim 1, wherein the first dopant includes boron.

6. The device of claim 5, wherein the second dopant includes indium.

7. An image sensor device, comprising:
    a semiconductor substrate having a pixel area and a logic area;
    a plurality of shallow trench isolation (STI) features formed in the semiconductor substrate to isolate active regions in the pixel area and the logic area;
    a guard ring well underlying each of the plurality of STI features;
    a light sensing element formed in the pixel area;

a first transistor having first gate structures formed in the pixel area;

a second transistor having second gate structures formed in the pixel area; and at least one dopant implanted in at least a portion of the pixel area and the logic area, the dopant implanted in at least the portion of the pixel area and the logic area before the first and second gate structures are formed.

8. The device of claim 7, wherein the light sensing element comprises a light sensing element selected from the group consisting of: a photodiode, pinned layer photodiode, photogate, and photo transistor.

9. The device of claim 7, wherein the first and second transistors comprise transistors selected from the group consisting of: a transfer gate transistor, reset transistor, source follower transistor, row select transistor, NMOS transistor, PMOS transistor, and combinations thereof.

10. The device of claim 7, wherein the at least one dopant comprises boron implanted with an implantation energy of about 160 KeV at an implantation dosage of about $1.5 \times 10^{13}$ atoms/cm$^2$.

11. The device of claim 7, further comprising:

a metal interconnect layer and an interlayer dielectric layer formed over the semiconductor substrate;

a color filter formed over the light sensing element to be aligned with the light sensing element; and a microlens formed over the color filter.

12. The device of claim 7, wherein the at least one dopant comprises a first dopant and a second dopant, the first dopant forming a well of the first transistor and the first dopant and the second dopant forming a well of the second transistor.

13. The device of claim 12, wherein the first dopant has a smaller atomic weight than the second dopant.

14. An image sensor device, comprising:

a semiconductor substrate having a pixel area and a logic area;

a plurality of shallow trench isolation (STI) features formed in the semiconductor substrate to isolate active regions in the pixel area and the logic area;

a guard ring well underlying each of the plurality of STI features;

a light sensing element formed in the pixel area;

a first transistor having first gate structures formed in the pixel area, the first transistor having a well of a first dopant; and a second transistor having second gate structures formed in the logic area, the second transistor having a well of the first dopant and a second dopant, wherein the first and second dopants are implanted before the first and second gate structures are formed.

15. The device of claim 14, wherein the light sensing element comprises a light sensing element selected from the group consisting of: a photodiode, pinned layer photodiode, photogate, and photo transistor.

16. The device of claim 14, wherein the first and second transistors comprise transistors selected from the group consisting of: a transfer gate transistor, reset transistor, source follower transistor, row select transistor, NMOS transistor, PMOS transistor, and combinations thereof.

17. The device of claim 14, further comprising:

a metal interconnect layer and an interlayer dielectric layer formed over the semiconductor substrate;

a color filter formed over the light sensing element to be aligned with the light sensing element; and a microlens formed over the color filter.

18. The device of claim 14, wherein the first dopant has a smaller atomic weight than the second dopant.

19. The device of claim 14, wherein the first dopant includes boron.

20. The device of claim 14, wherein the second dopant includes indium.

* * * * *